United States Patent [19]
Yamada

[11] 4,451,794
[45] May 29, 1984

[54] PHASE COMPARATOR

[75] Inventor: Takaaki Yamada, Zama, Japan

[73] Assignee: Sony Corporation, Tokyo, Japan

[21] Appl. No.: 363,030

[22] Filed: Mar. 29, 1982

[30] Foreign Application Priority Data

Apr. 2, 1981 [JP] Japan ............................ 56-49846

[51] Int. Cl.³ ............................................ H03D 13/00
[52] U.S. Cl. ..................................... 328/134; 307/516
[58] Field of Search ............... 307/514, 516, 525, 526;
328/133, 134

[56] References Cited

U.S. PATENT DOCUMENTS

| | | | |
|---|---|---|---|
| 3,430,148 | 2/1969 | Miki | 328/133 |
| 3,610,954 | 10/1971 | Treadway | 328/133 |
| 3,626,307 | 12/1971 | Koyama | 307/525 |
| 4,277,754 | 7/1981 | Minakuchi | 328/133 |
| 4,291,274 | 9/1981 | Suzuki et al. | 328/134 |

Primary Examiner—John S. Heyman
Attorney, Agent, or Firm—Hill, Van Santen, Steadman & Simpson

[57] ABSTRACT

A phase comparator includes a first signal input terminal supplied with a reference signal, a second signal input terminal supplied with an input signal to be compared with the reference signal, a first gate circuit having a pair of input terminals and an output terminal, one of the pair of input terminals of which is connected to the first signal input terminal, a second gate circuit having a pair of input terminals and an output terminal, one of the pair of input terminals of which is connected to the second signal input terminal, a first bi-stable circuit having set, reset and output terminals, the set terminal of which is connected to the output terminal of the first gate circuit, a second bi-stable circuit having set, reset and output terminals, the set terminal of which is connected to the output terminal of the second gate circuit, and first and second gate control circuits connected between the other input terminals of the first and second gate circuits and the output terminals of the first and second bi-stable circuits operative to open one of the first and second gate circuit alternately. The output signal proportional to the phase difference between the input signal and the reference signal is produced at one of the output terminals of the first and second bi-stable circuit in accordance with whether the input signal phase-advances more than the reference signal or not.

14 Claims, 41 Drawing Figures

FIG. 2A (f1)
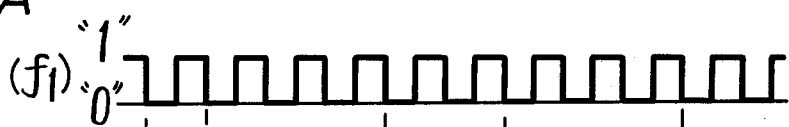
FIG. 2B (f2)
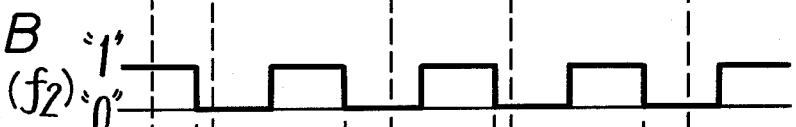
FIG. 2C (S01)
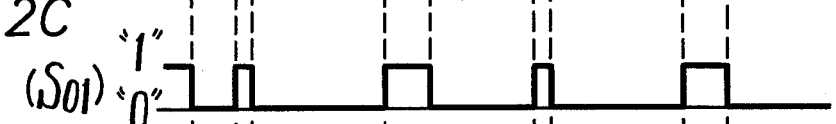
FIG. 2D (S02)
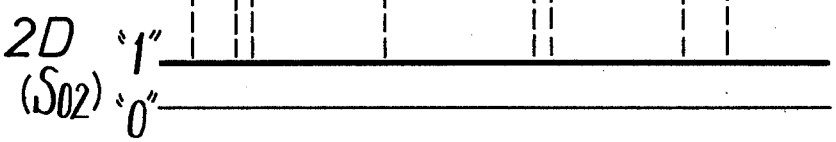
FIG. 3A (f1)
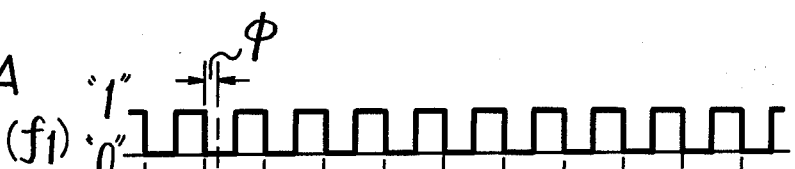
FIG. 3B (f2)
FIG. 3C (S01)
FIG. 3D (S02)
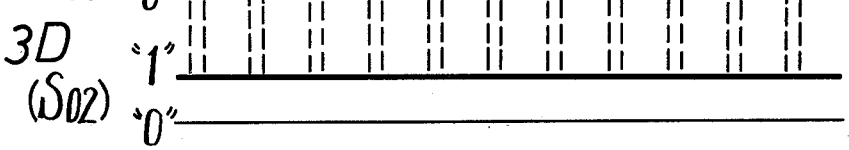

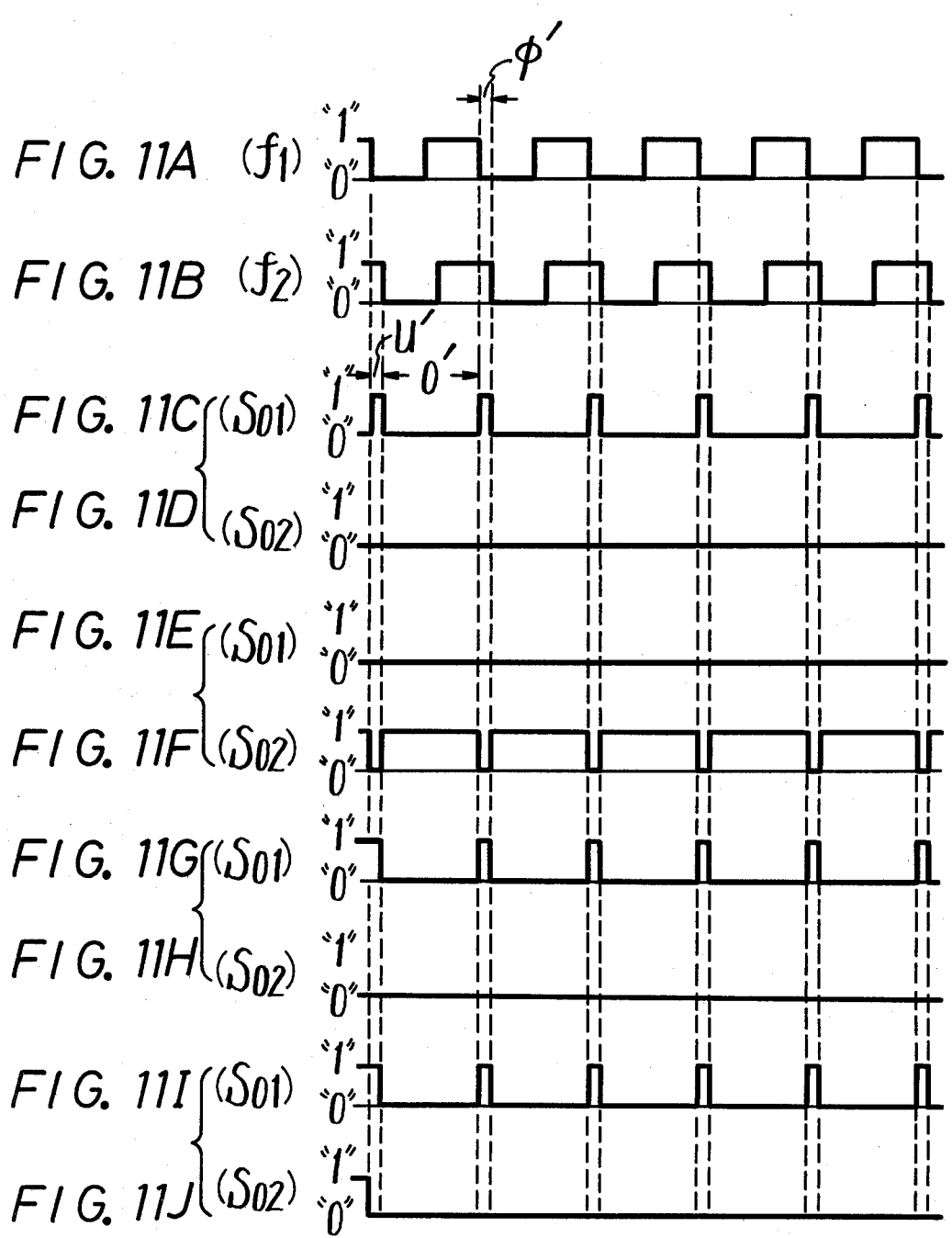

PHASE COMPARATOR

BACKGROUND OF THE INVENTION

1. Field of the Invention

The present invention relates generally to a phase comparator and is directed more particularly to a phase comparator for use in a phase locked loop circuit.

2. Description of the Prior Art

In general, a phase locked loop circuit (hereinafter, simply referred to as a PLL circuit) includes a voltage-controlled oscillator, a phase comparator and so on. The phase comparator is supplied with, for example, a reference signal and an oscillating signal from a voltage-controlled oscillator, in which they are compared for phase and then this phase comparator produces an error signal in accordance with a phase difference between these two signals. Then, this error signal is supplied through, for example, a low pass filter to the voltage-controlled oscillator as a control signal, so that the output signal from this voltage-controlled oscillator is synchronized with the reference signal.

In the past, as the phase comparator utilized in such PLL circuit, there has been proposed such one as illustrated in FIG. 1.

In FIG. 1, reference numeral 1a generally denotes an input terminal supplied with, for example, a reference signal $f_1$ and 1b denotes an input terminal to which an oscillating signal $f_2$ is supplied from, for example, a voltage-controlled oscillator. Numerals 2 to 10 respectively designate NAND circuits in which each pair of the NAND circuits 2 and 9, 3 and 4, 5 and 6 and 7 and 10 forms a flip-flop circuit. In addition, numerals 11a and 11b represent one and the other output terminals at which signals corresponding to the phase difference between the aforesaid reference signal $f_1$ and oscillating signal $f_2$ are produced.

In the phase comparator thus composed, as shown in FIGS. 2A and 2B, when the frequency of the oscillating signal $f_2$ which will be supplied to the input terminal 1b is lower than that of the reference signal $f_1$ which will be supplied to the input terminal 1a, at the one and other output terminals 11a and 11b are produced such signals $S_{01}$ and $S_{02}$ as shown in FIGS. 2C and 2D. That is, at the output terminal 11a is achieved the signal $S_{01}$ which has a longer period of low level "0" if the frequency of the oscillating signal $f_2$ is lower and lower as compared with the frequency of the reference signal $f_1$, while at the output terminal 11b is produced the signal $S_{02}$ which is always at high level "1". Accordingly, by supplying these output signals $S_{01}$ and $S_{02}$ to, for example, the voltage-controlled oscillator as the control signal, it is possible to control the voltage-controlled oscillator such that the frequency and the phase of the oscillating signal $f_2$ may take the same direction as those of the reference signal $f_1$.

On the other hand, as shown, for example, in FIGS. 3A and 3B, when the frequency of the oscillating signal $f_2$ which will be supplied to the input terminal 1b is same as that of the reference signal $f_1$ which will be supplied to the input terminal 1a but the phase thereof is delayed from the reference signal $f_1$ by $\phi$, at the one and other output terminals 11a and 11b are derived such signals $S_{01}$ and $S_{02}$ as shown in FIGS. 3C and 3D. That is, at the one output terminal 11a is achieved the signal $S_{01}$ which becomes the low level "0" periodically only in the period responsive to the phase difference $\phi$, whereas at the other output terminal 11b is achieved the signal $S_{02}$ which always becomes the high level "1". Therefore, by supplying these output signals $S_{01}$ and $S_{02}$ to, for example, the voltage-controlled oscillator as the control signal, it is possible to control the voltage-controlled oscillator such that the phase of the oscillating signal $f_2$ may take the same direction as that of the reference signal $f_1$.

As described above, according to the phase comparator as illustrated in FIG. 1, in accordance with the phase difference of the oscillating signal $f_2$ relative to the reference signal $f_1$, at the one and other output terminals 11a and 11b can be derived the signals $S_{01}$ and $S_{02}$ each corresponding thereto. Thus, by controlling, for example, the voltage-controlled oscillator in association with these output signals $S_{01}$ and $S_{02}$, it is possible to coincide the frequency and the phase of the oscillating or comparing signal $f_2$ with those of the reference signal $f_1$.

Nevertheless, such phase comparator as seen in FIG. 1 utilizes four flip-flop circuits, each comprised of the NAND circuits (pairs of the NAND circuits 2 and 9, 3 and 4, 5 and 6, 7 and 10 compose the flip-flop circuits, respectively), so that the wirings thereamong are very complicated, and in relation to the number of circuit elements or logics used therein, the conventional phase comparator is relatively expensive.

OBJECTS AND SUMMARY OF THE INVENTION

Therefore, it is an object of the present invention to provide a phase comparator which can obviate the aforesaid defects inherent to the prior art.

It is another object of the present invention to provide a phase comparator particularly suitable for use in a phase locked loop circuit.

In accordance with the aspects of the invention, a phase comparator is disclosed, which includes a first signal input terminal supplied with a reference signal, a second signal input terminal supplied with an input signal to be compared with the reference signal, a first gate circuit having a pair of input terminals and an output terminal, one of the pair of the input terminals of which is connected to the first signal input terminal, a second gate circuit having a pair of input terminals and an output terminal, one of the pair of input terminals of which is connected to the second signal input terminal, a first bi-stable circuit having set, reset and output terminals, the set terminal of which is connected to the output terminal of the first gate circuit, a second bi-stable circuit having set, reset and output terminals, the set terminal of which is connected to the output terminal of the second gate circuit, a first gate control device connected between the output terminal of the second bi-stable circuit and the other of the pair of the input terminals of the first gate circuit, a second gate control device connected between the output terminal of the first bi-stable circuit and the other of the pair of the input terminals of the second gate circuit, a first resetting device connected between the first signal input terminal and the reset terminal of the second bi-stable circuit, and a second resetting device connected between the second signal input terminal and the reset terminal of the first bi-stable circuit.

The other objects, features and advantages of the present invention will become apparent from the following description taken in conjunction with the attached drawings.

BRIEF DESCRIPTION OF THE DRAWINGS

FIGS. 2A to 2D and FIGS. 3A to 3D are respectively waveform diagrams used to explain the operation of the prior art phase comparator seen in FIG. 1;

FIGS. 10A to 10D and FIGS. 11A to 11J are waveform diagrams used to explain the operation of the phase comparator according to the present invention.

DESCRIPTION OF THE PREFERRED EMBODIMENTS

The embodiments of the phase comparator according to the present invention will hereinafter be described with reference to the drawings.

Figure 1:
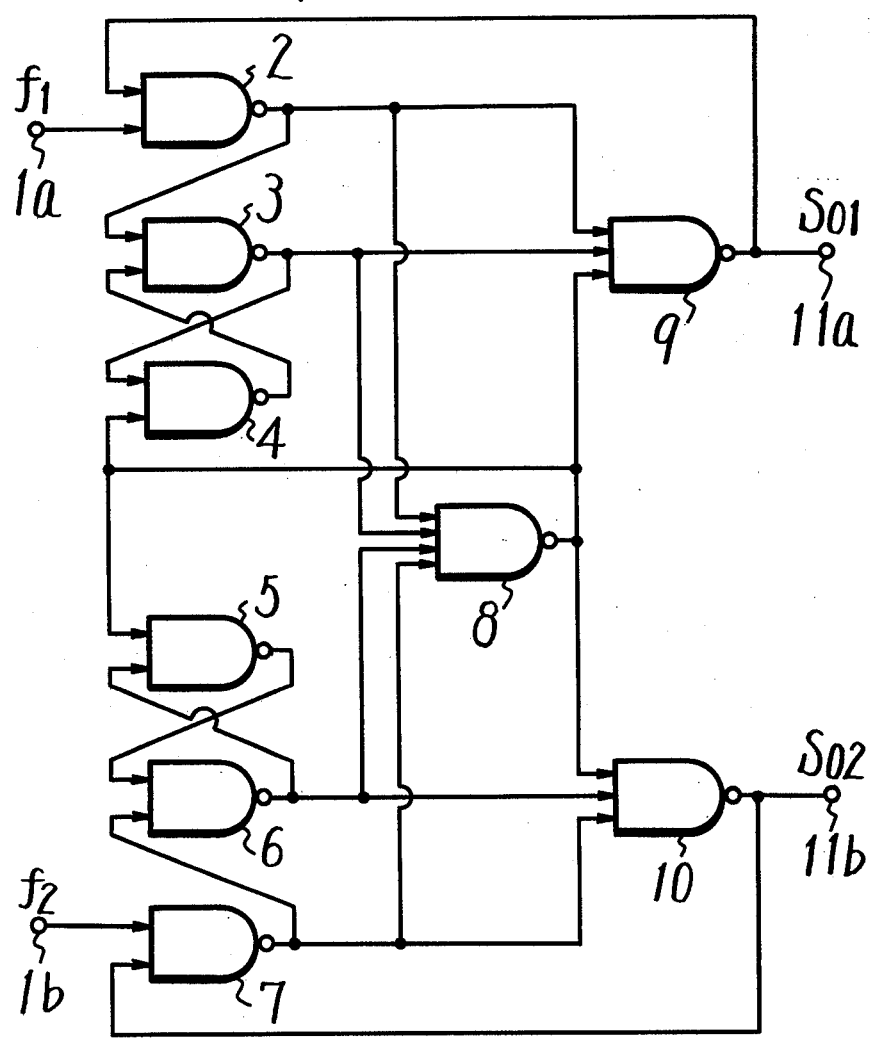
FIG. 1 is a circuit block diagram schematically showing one example of a conventional phase comparator.
Figure 4:
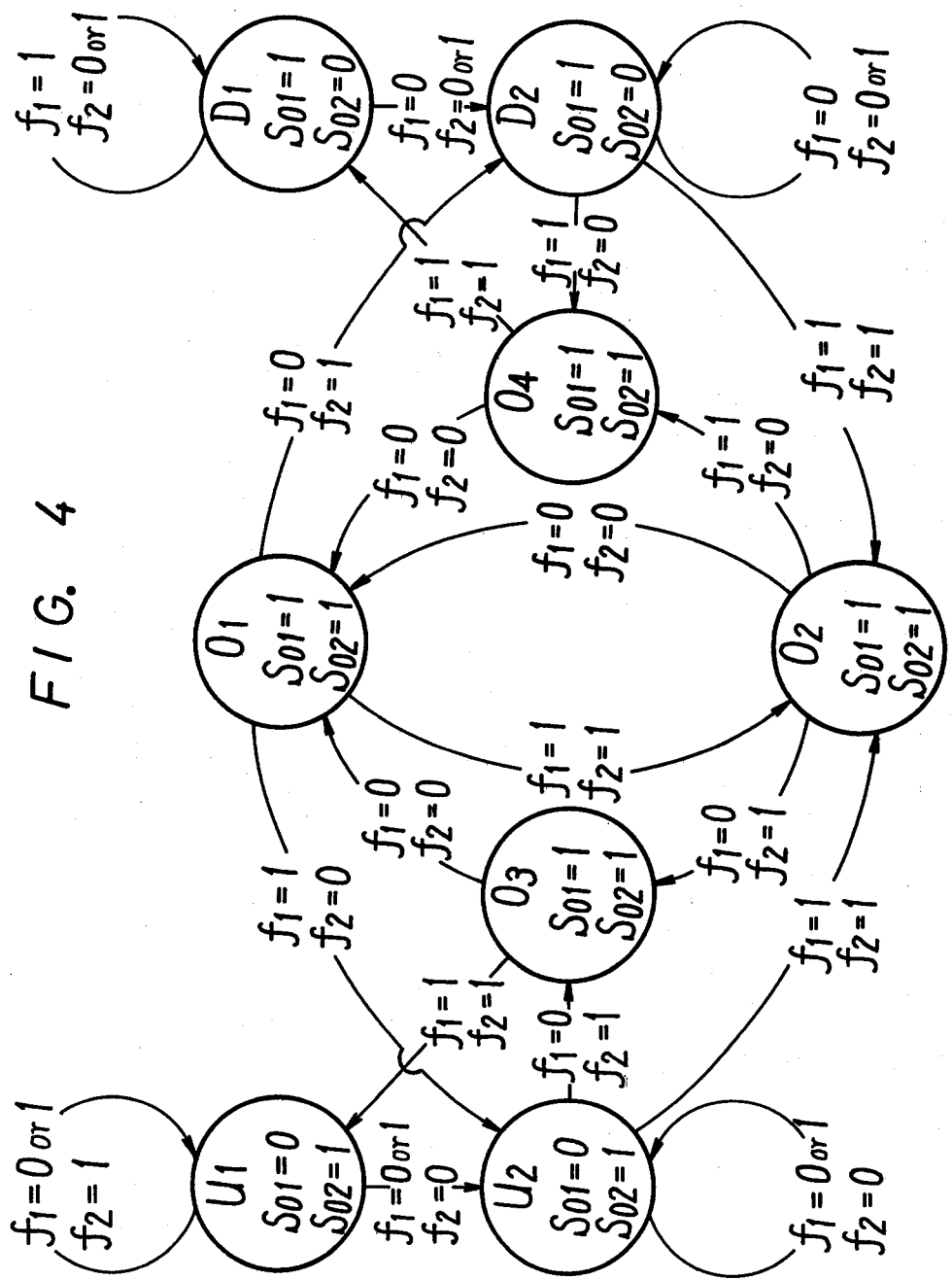
FIGS. 4 and 5 are state transition diagrams each used to explain the stable point of the conventional phase comparator as described above in FIG. 1.

By the way, FIG. 4 is a state transition diagram showing the state transition of the prior art phase comparator previously discussed with reference to FIG. 1. As will be apparent from FIG. 4, through the experiments, it was ascertained that the conventional phase comparator was transited with eight stable states of $U_1$, $U_2$, $O_1$, $O_2$, $O_3$, $O_4$, $D_1$ and $D_2$.

Figure 5:
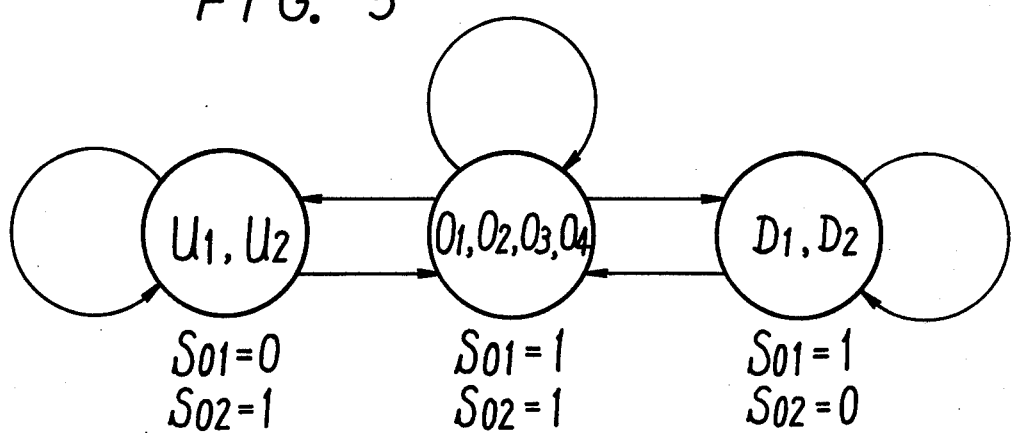

In this case, the signals $S_{01}$ and $S_{02}$ produced at the output terminals 11a and 11b (FIG. 1) become "0" and "1" when the prior art phase comparator is in the states of $U_1$ and $U_2$, "1" and "1" when $O_1$, $O_2$, $O_3$ and $O_4$, and "1" and "0" when $D_1$ and $D_2$, respectively. Accordingly, it may be considered that these eight stable states of $U_1$, $U_2$, $O_1$, $O_2$, $O_3$, $O_4$, $D_1$ and $D_2$ will be collected into, for example, three sets as shown in FIG. 5.

Figure 6:
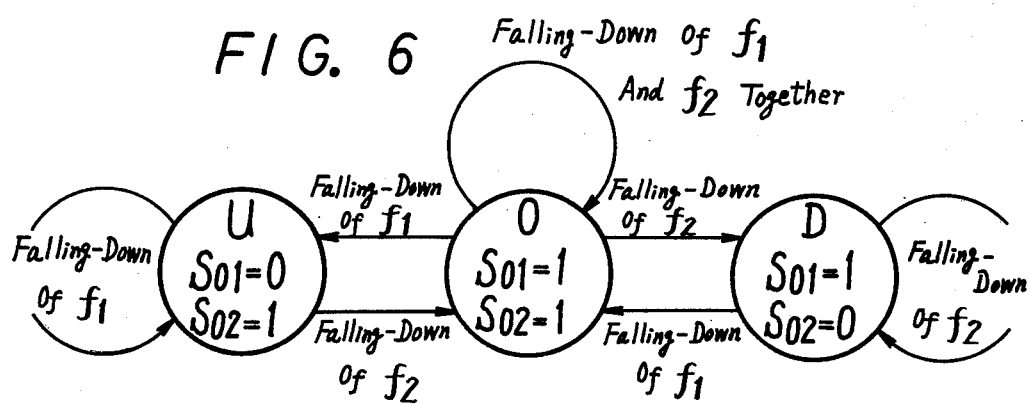
FIG. 6 is a fundamental state transition diagram showing a stable point of a phase comparator which is utilized in the present invention.

To develop the above consideration further, as shown by the state transition diagram in FIG. 6, if three stable states U, O and D (in the state U, $S_{01}$="0" and $S_{02}$="1", in the state O, $S_{01}$="1" and $S_{02}$="1" and in the state D, $S_{01}$="1" and $S_{02}$="0") are taken for a phase comparator and if the phase comparator is changed in state along the rule such as shown in the figure, it was ascertained that output signals same as those of the prior art phase comparator described above could be obtained.

Figures 7, 8A, 8B, 8C, 8D, 8E, 8F:
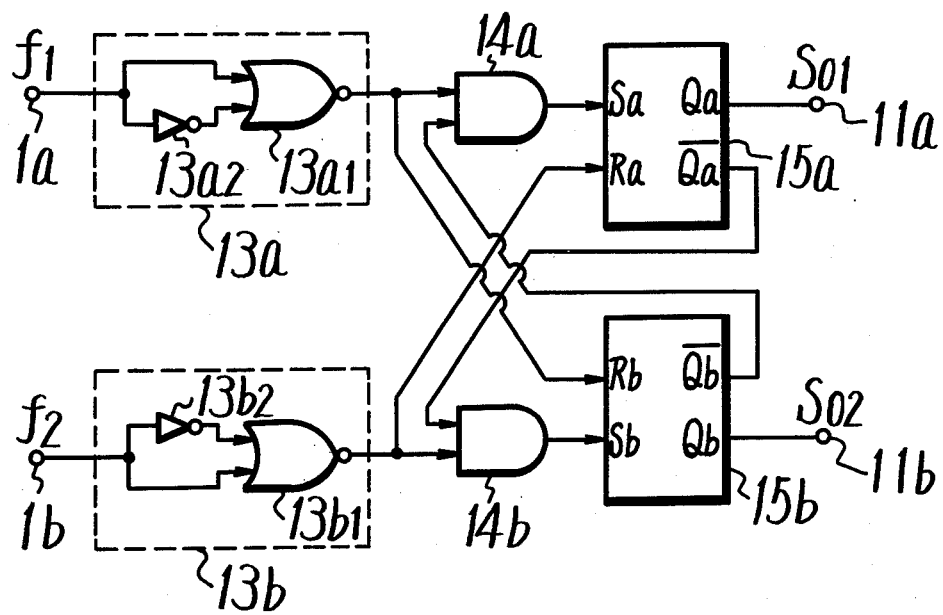
FIG. 7 is a circuit block diagram showing one embodiment of the phase comparator according to the present invention.
FIGS. 8A to 8F are waveform diagrams used to explain the operation of a trigger pulse oscillator used in the present invention.

Therefore, one embodiment of a phase comparator according to the present invention for achieving the aforesaid transition characteristic in FIG. 6 will hereinafter be described with reference to FIG. 7. In FIG. 7, the like references corresponding to those of FIG. 1 designate the same elements and parts and hence they will not be described in detail for simplicity.

As illustrated in FIG. 7, the input terminal $1_a$ which will be supplied with, for example, the reference signal $f_1$ is connected to one input terminal or side of a NOR circuit $13_{a1}$ comprising a trigger pulse generator or oscillator $13_a$, and also connected through an inverter $13_{a2}$ to the other input side of the NOR circuit $13_{a1}$. In this case, a delay time of the inverter $13_{a2}$ is selected as $2\tau$. By way of example, if an input signal $f_1$ such as, shown in FIG. 8A is supplied to the input terminal $1_a$, the inverter $13_{a2}$ produces at its output side a signal such as, shown in FIG. 8B. Accordingly, the NOR circuit $13_{a1}$ produces at its output terminal a trigger pulse having a pulse width $2\tau$ as shown in FIG. 8C when the signal which is supplied to the input terminal $1_a$ falls down.

The output side of this NOR circuit $13_{a1}$ is connected to one input side of an AND circuit $14_a$ forming a gate circuit and the output side of this AND circuit $14_a$ is connected to a set signal input terminal $S_a$ of a flip-flop circuit $15_a$.

The input terminal $1_b$ to which a signal such as, the oscillating signal $f_2$ is supplied from the voltage-controlled oscillator, is connected to one input side of a NOR circuit $13_{b1}$ forming a trigger pulse generator or oscillator $13_b$ and also connected through an inverter $13_{b2}$ to the other input side of the NOR circuit $13_{b1}$. This trigger pulse oscillator $13_b$ is constructed same as the trigger pulse oscillator $13_a$ as described above, in which as the output of the NOR circuit $13_{b1}$ is produced a trigger pulse having a pulse width $2\tau$ at the falling-down edge of the signal which is supplied to the input terminal $1_b$.

The output side of this NOR circuit $13_{b1}$ is connected to one input side of an AND circuit $14_b$ comprising a gate circuit and the output side of this AND circuit $14_b$ is connected to a set signal input terminal $S_b$ of a flip-flop circuit $15_b$.

Also, the output side of the NOR circuit $13_{b1}$ is connected to a reset signal input terminal $R_a$ of the flip-flop circuit $15_a$ and an inverted output terminal $\overline{Qa}$ of this flip-flop circuit $15_a$ is connected to the other input side of the AND circuit $14_b$.

The output side of the NOR circuit $13_{a1}$ is also connected to a reset signal input terminal $R_b$ of the flip-flop circuit $15_b$ and an inverted output terminal $\overline{Qb}$ of this flip-flop circuit $15_b$ is connected to the other input side of the AND circuit $14_a$.

Then, from the output terminals $\overline{Qa}$ and $\overline{Qb}$ of the flip-flop circuits $15_a$ and $15_b$ are led out the one and other output terminals $11_a$ and $11_b$.

In this case, the trigger pulse generated from the trigger pulse oscillator $13_a$ is supplied through the AND circuit $14_a$ to the set signal input terminal $S_a$ of the flip-flop circuit $15_a$, whereby this flip-flop circuit $15_a$ is set. That is, the flip-flop circuit $15_a$ is set in such a state that its output terminal $Q_a$ will produce the high level signal "1" and its inverted output terminal $\overline{Qa}$ will produce the low level signal "0". In this case, however, when the flip-flop circuit $15_b$ is in the set state, that is, when the flip-flop circuit $15_b$ is in the state such that the low level signal "0" is produced at the inverted output terminal $\overline{Qb}$, the gate circuit formed of the AND circuit $14_a$ is in the open state. Thus the trigger pulse from the trigger pulse oscillator $13_a$ is not supplied to the set signal input terminal $S_a$ of the flip-flop circuit $15_a$, so that this flip-flop circuit $15_a$ is not set. In other words, the set of the flip-flop circuit $15_a$ is inhibited.

The trigger pulse derived from the trigger pulse oscillator $13_a$ is also supplied to the reset signal input terminal $R_b$ of the flip-flop circuit $15_b$, by which the flip-flop circuit $15_b$ is reset. That is, the flip-flop circuit $15_b$ is made in the state such that the low level signal "0" is produced at its output terminal Qb and the high level signal "1" is produced at the inverted output terminal $\overline{Qb}$ thereof.

Similarly, the trigger pulse produced from the trigger pulse oscillator $13_b$ is delivered through the AND circuit $14_b$ to the set signal input terminal Sb of the flip-flop circuit $15_b$, by which this flip-flop circuit $15_b$ is set. That is, the flip-flop circuit $15_b$ is made in the state such that the high level signal "1" is produced at the output terminal Qb and the low level signal "0" is produced at the inverted output terminal $\overline{Qb}$. However, also in this case, when the flip-flop circuit $15_a$ is in the set state, that is, when the low level signal "0" is produced at the inverted output terminal $\overline{Qa}$ thereof, the gate circuit comprised of the AND circuit $14_b$ is in the open state. Thus the trigger pulse from the trigger pulse oscillator $13_b$ is not supplied to the set signal input terminal Sb of the flip-flop circuit $15_b$, so that this flip-flop circuit $15_b$ is not set. In other words, the set of the flip-flop circuit $15_b$ is inhibited.

Further, the trigger pulse generated from the trigger pulse oscillator $13_b$ is delivered to the reset signal input terminal Ra of the flip-flop circuit $15_a$ to thereby permit the flip-flop circuit $15_a$ to be reset. That is, the flip-flop circuit $15_a$ is made in the state that the low level signal "0" is produced at the output terminal Qa and the high level signal "1" is produced at the inverted output terminal $\overline{Qb}$.

In addition, in this case, when the trigger pulses to set and reset these flip-flop circuits $15_a$ and $15_b$ are supplied together at the same time, because of the delay by the AND circuits $14_a$ and $14_b$, the reset is dominant to the set so that these flip-flop circuits $15_a$ and $15_b$ are made in the reset states.

In this way, according to the phase comparator of this embodiment shown in FIG. 7, when the signal $f_1$ which is supplied to the input terminal $1a$ falls down (that is, it is changed from the high level "1" to the low level "0"), the flip-flop circuits $15_a$ and $15_b$ are set and reset, respectively. Whereas, when the signal $f_2$ which is supplied to the input terminal $1b$ falls down, the flip-flop circuits $15_a$ and $15_b$ are reset and set, respectively. However, in this case, if the one of the flip-flop circuits $15_a$ and $15_b$ is already in the set state, the other is inhibited from being set.

Figure 9:
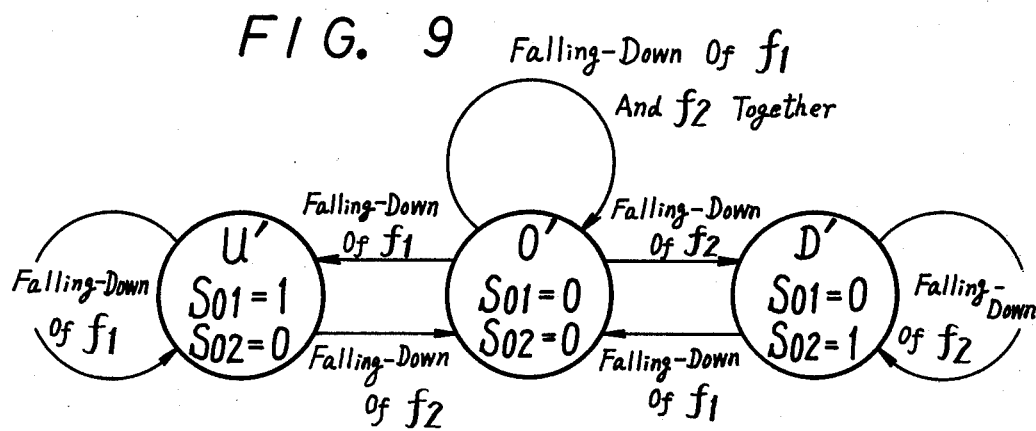
FIG. 9 is a state transition diagram showing a practical operation of the phase comparator according to the present invention.

FIG. 9 shows a state transition of the phase comparator according to this embodiment which has three stable states U', O' and D' (in the state of U', $S_{01}$="1" and $S_{02}$="0", in the state of O', $S_{01}$="0" and $S_{02}$="0" and in the state of D', $S_{01}$="0" and $S_{02}$="1") and which is transited in state along the rule as shown in the figure. This state transition diagram of FIG. 9 is equivalent to the simplified state transition diagram of the phase comparator as shown in FIG. 6.

Therefore, the phase comparator of this embodiment presents the state transition nearly same as that of the phase comparator with the state transition shown in FIG. 6.

Figure 10A:
Figure 10B:
Figure 10C:
Figure 10D:
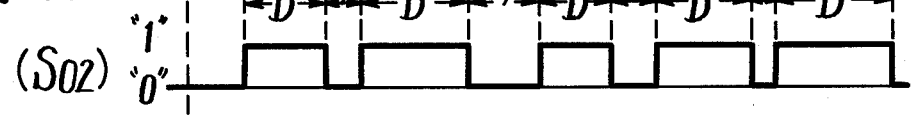

When the phase comparator of this embodiment is supplied at its input terminals $1_a$ and $1_b$ with the signals $f_1$ and $f_2$ ($f_2 > f_1$ in frequency) such as shown in FIGS. 10A and 10B, the signals $S_{01}$ and $S_{02}$ derived at the one and other output terminals $11_a$ and $11_b$ thereof become those shown in FIGS. 10C and 10D, respectively. That is, at the output terminal $11_b$ is produced the signal $S_{02}$ whose period of the low level "0" changes in accordance with the difference between the frequency of the oscillating signal $f_2$ and that of the reference signal $f_1$, and at the output terminal $11_a$ is produced the signal $S_{01}$ which is always the low level "0". Accordingly, if these output signals $S_{01}$ and $S_{02}$ are supplied to, for example, the voltage-controlled oscillator as the control signal, it is possible to control the voltage-controlled oscillator such that the frequency and the phase of the oscillating signal $f_2$ may become the same as those of the reference signal $f_1$. Although in this example, the initial values of the output signals $S_{01}$ and $S_{02}$ are respectively "0" and "0", in other cases, that is, even when the initial values of the signals $S_{01}$ and $S_{02}$ are "0" and "1", "1" and "0", and "1" and "1", respectively, since the initial values of the output signals $S_{01}$ and $S_{02}$ are reset at a time point $t_1$, thereafter they become same as one other.

Also, when the phase comparator according to this embodiment of FIG. 7 is supplied at its input terminals $1_a$ and $1_b$ with the signals $f_1$ and $f_2$ such as shown in FIGS. 11A and 11B (signals $f_1$ and $f_2$ are same one another in frequency but have a phase difference $\phi'$ therebetween), the signals $S_{01}$ and $S_{02}$ produced at the one and other output terminals $11_a$ and $11_b$ become respectively those shown in FIGS. 11C and 11D. That is, at the one output terminal $11_a$ is produced the signal $S_{01}$ which periodically becomes high level "1" during only the period corresponding to the phase difference $\phi'$ and at the other output terminal $11_b$ is provided the signal $S_{02}$ which always becomes the low level "0". Consequently, if these output signals $S_{01}$ and $S_{02}$ are supplied to, for example, the voltage-controlled oscillator as the control signal, it is possible to control the voltage-controlled oscillator such that the phase of the oscillating signal $f_2$ will become the same as that of the reference signal $f_1$. While FIG. 11C and 11D are the cases where the initial values of these output signals $S_{01}$ and $S_{02}$ are "0" and "0", when the initial values of the output signals $S_{01}$ and $S_{02}$ are "0" and "1", these output signals $S_{01}$ and $S_{02}$ become those shown in FIGS. 11E and 11F, when "1" and "0", they become those shown in FIGS. 11G and 11H and when "1" and "1", they become those shown in FIGS. 11I and 11J, respectively.

As described above, the phase comparator according to the present invention has by no means an inferior function as compared with the conventional phase comparator. In addition, since it is formed of two flip-flop circuits $15_a$ and $15_b$, the circuit arrangement thereof is very simple and hence it becomes less expensive as compared with the conventional phase comparator.

Next, with reference to FIGS. 12 through FIGS. 18, other embodiments of the phase comparator according to the present invention will be described. In FIGS. 12 to 18, the like parts corresponding to those of FIG. 7 are marked with the same references and their detailed explanation will be omitted.

Figure 12:
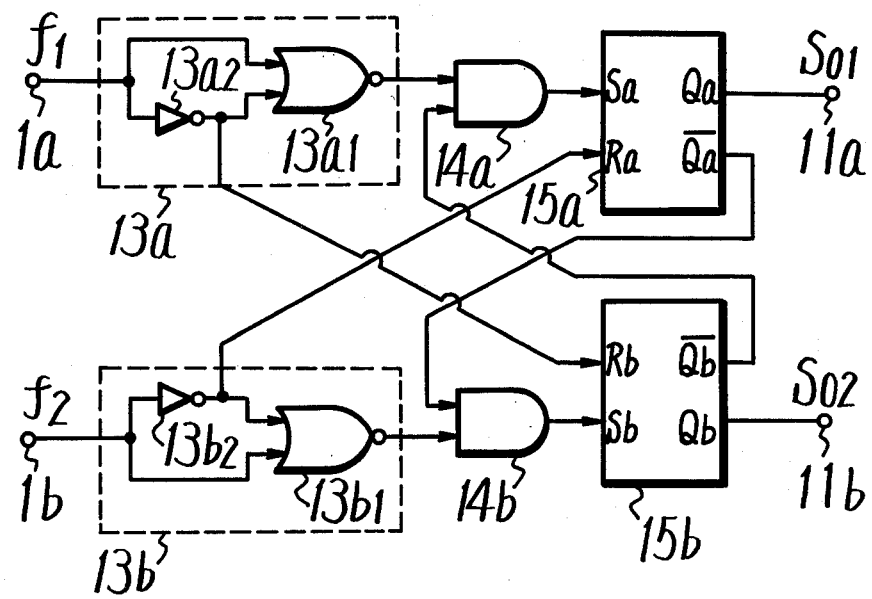
FIGS. 12 to 18 are circuit block diagrams each showing other embodiments of the phase comparator according to the present invention.

In the phase comparator shown in FIG. 12, the output side of the inverter $13_{a2}$ is connected to the reset signal input terminal Rb of the flip-flop circuit $15_b$ and the output side of the inverter $13_{b2}$ is connected to the reset signal input terminal Ra of the flip-flop circuit $15_a$. The other circuit construction is substantially arranged same as that of the embodiment in FIG. 7.

The phase comparator shown in FIG. 12 has the similar operation and effect to those of the embodiment of FIG. 7 and in addition, the flip-flop circuits $15_a$ and $15_b$ are reset by the signal as shown in FIG. 8B, so that for example, when the signals $f_1$ and $f_2$ each supplied to the input terminals $1_a$ and $1_b$ fall down at the same time, both of the flip-flop circuits $15_a$ and $15_b$ can be reset surely.

Figure 13:
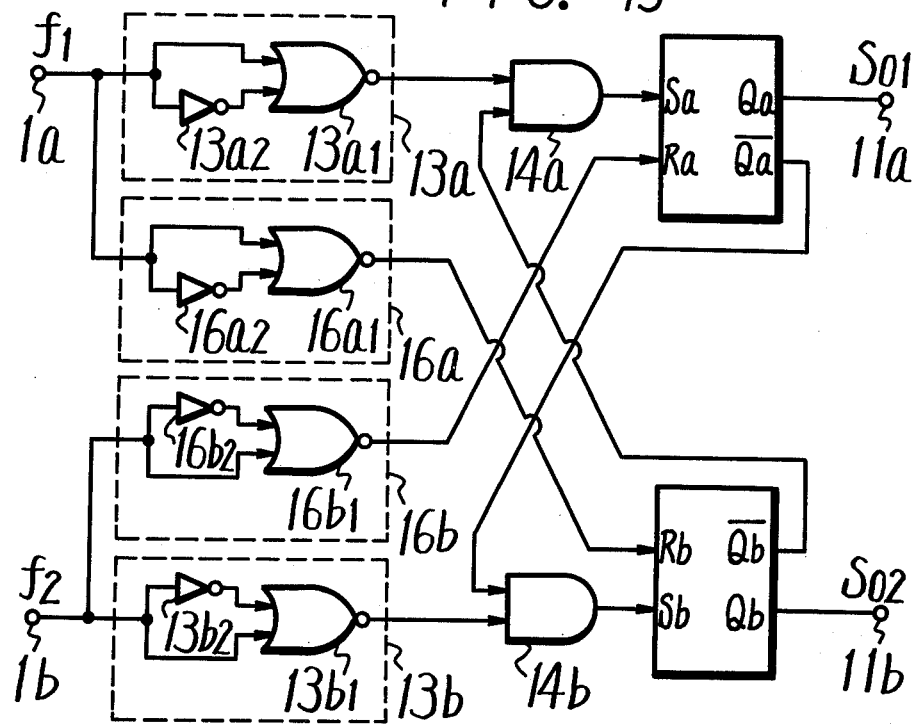

Further, in the phase comparator as shown in FIG. 13, there are further provided trigger pulse generators $16_a$ and $16_b$ and the flip-flop circuits $15_a$ and $15_b$ are respectively reset by the trigger pulses produced from these trigger pulse oscillators $16_a$ and $16_b$. In this case, a delay time which will be decided by inverters $16_{a2}$ and $16_{b2}$ comprising the respective trigger pulse oscillators $16_a$ and $16_b$ is selected as $3\tau$. If the input terminals $1_a$ and $1_b$ are supplied with the signal as shown in FIG. 8A, the inverters $16_{a2}$ and $16_{b2}$ produce at their output sides the signal such as shown FIG. 8D, so that NOR circuits $16_{a1}$ and $16_{b1}$ produce at their output sides trigger pulses each having a pulse width $3\tau$ at the falling-down of the signal supplied to the input terminals $1_a$ and $1_b$ as shown in FIG. 8E. Then, these trigger pulses are supplied to the reset signal input terminals $R_b$ and $R_a$ of the flip-flop circuits $15_b$ and $15_a$. The other elements and parts are constructed same as those of the embodiment in FIG. 7.

Figure 14:
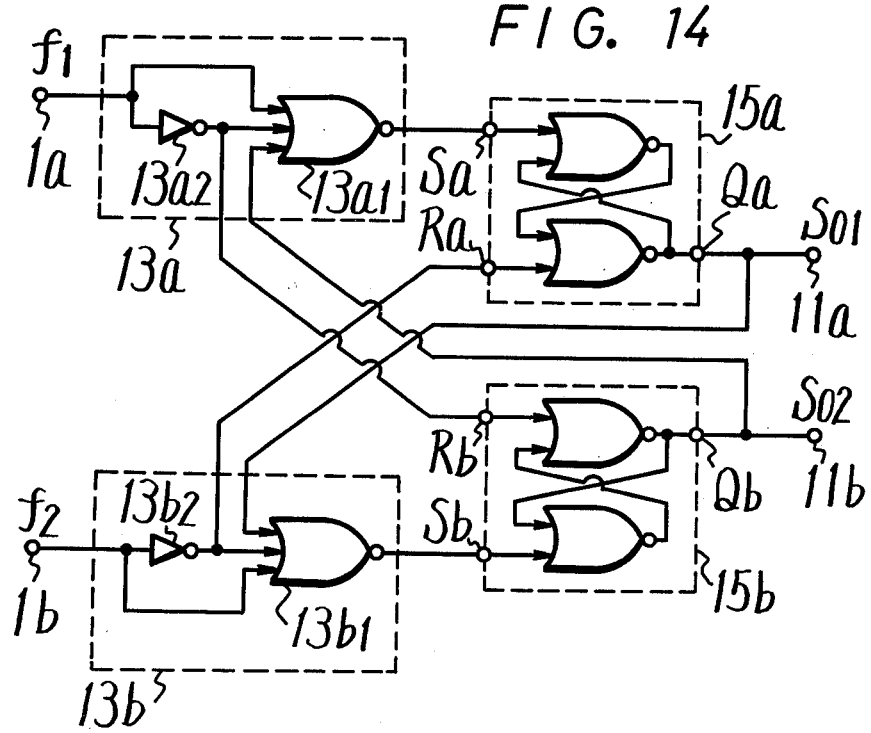

Next, in the phase comparator as illustrated in FIG. 14, as the NOR circuits $13_{a1}$, and $13_{b1}$ forming the trigger pulse oscillators $13_a$ and $13_b$, are utilized three-input NOR circuits, by which the gate circuits for use in inhibiting the flip-flop circuits $15_a$ and $15_b$ from being set are constructed.

In the embodiments of the phase comparators shown in FIGS. 13 and 14, it is possible to achieve the same operation and effect as those of the phase comparator as seen in FIG. 12.

Figure 15:
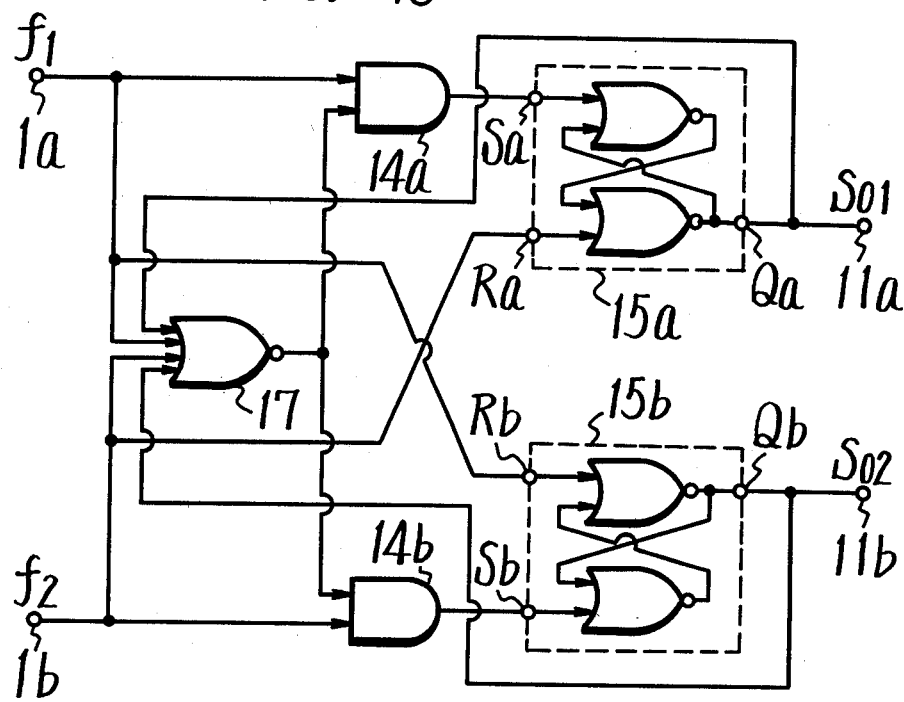

Next, FIG. 15 shows a further example of the phase comparator according to the invention in which a four-input NOR circuit 17 constructs the trigger pulse generator and the gate circuits for use in inhibiting the flip-flop circuits $15_a$ and $15_b$ from being set.

Figure 16:
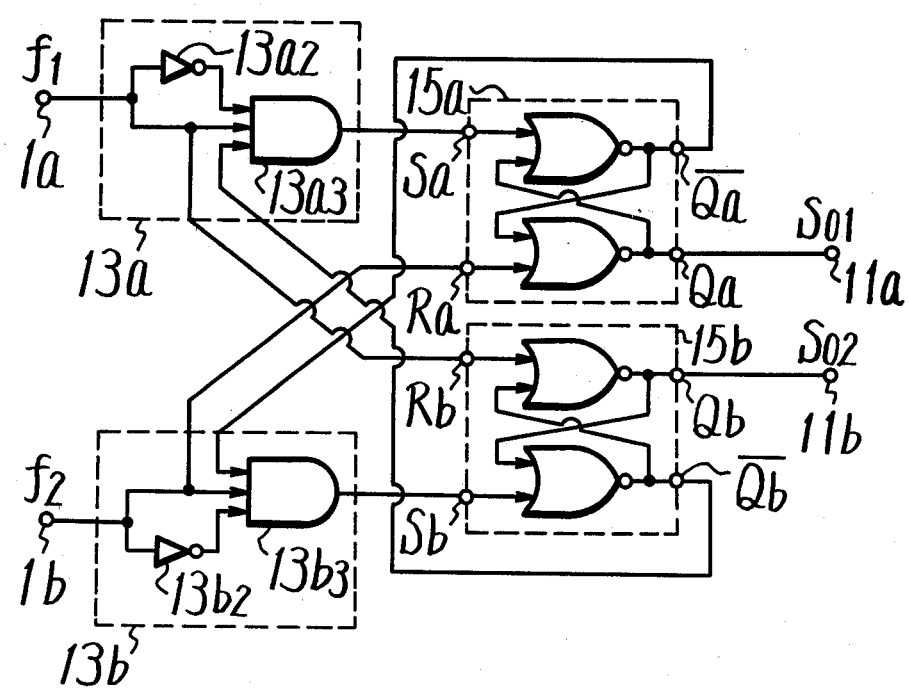

Further, in the phase comparator of the invention shown in FIG. 16, there are utilized three-input AND circuits $13_{a3}$ and $13_{b3}$ which provide the trigger pulse oscillators $13_a$ and $13_b$ and the gate circuits for use in inhibiting the flip-flop circuits $15_a$ and $15_b$ from being set. In this case, when a delay time by the inverters $13_{a2}$ and $13_{b2}$ is specified as $2\tau$, these AND circuits $13_{a3}$ and $13_{b3}$ produce at their output sides the trigger pulses each having the pulse width $2\tau$ at the rising-up of the signals supplied to the input terminals $1_a$ and $1_b$ as shown in FIG. 8F, which are respectively supplied to the set signal input terminals Sa and Sb of the flip-flop circuits $15_a$ and $15_b$.

Also in the embodiments of the phase comparators shown in FIGS. 15 and 16, it is possible to achieve the same operation and effect as those of the embodiment in FIG. 7.

Figure 17:
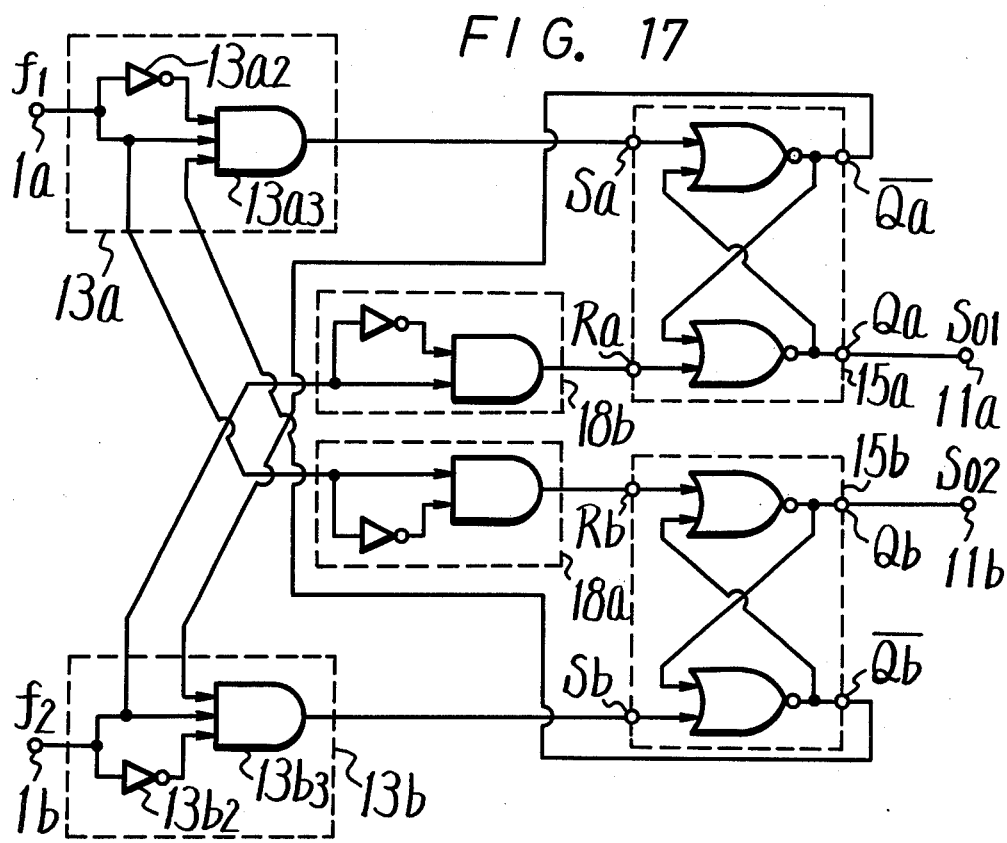

Further, FIG. 17 shows another embodiment of the phase comparator according to the invention in which trigger pulse generators $18_a$ and $18_b$ are further provided for the phase comparator seen in FIG. 16 and the trigger pulses formed from these trigger pulse oscillators $18_a$ and $18_b$ are supplied to the reset signal input terminals $R_b$ and $R_a$ of the flip-flop circuits $15_b$ and $15_a$.

Figure 18:
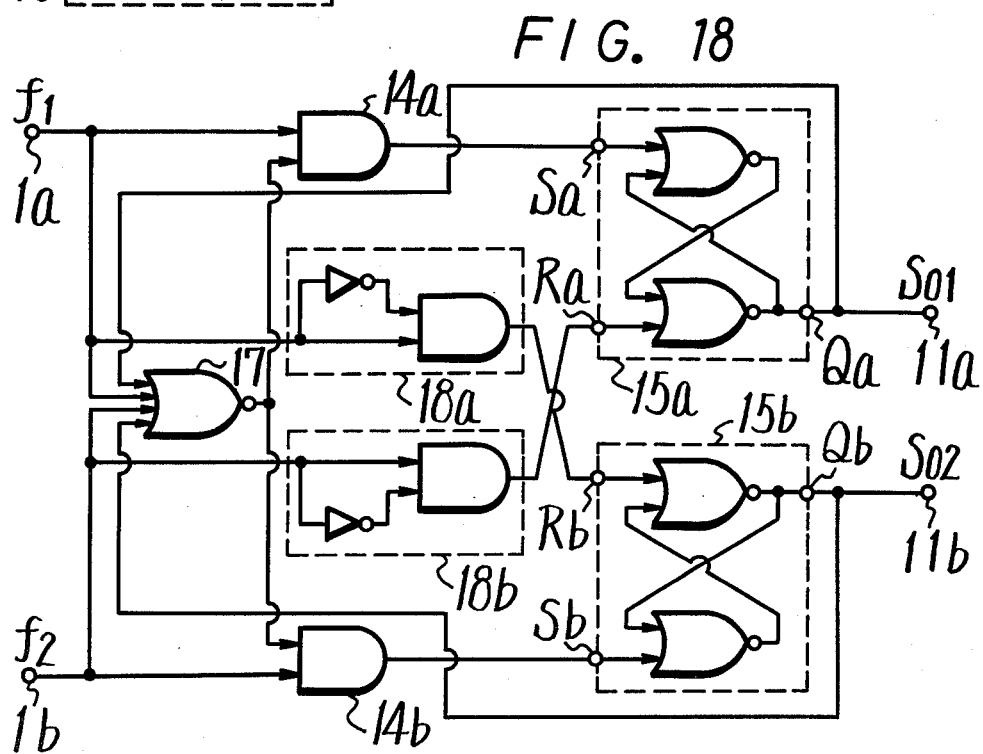

In addition, FIG. 18 shows a yet further embodiment of the phase comparator of the invention in which the trigger pulse oscillators $18_a$ and $18_b$ are also provided for the phase comparator seen in FIG. 15 and the trigger pulses formed from these trigger pulse oscillators $18_a$ and $18_b$ are supplied to the reset signal input terminals $R_b$ and $R_a$ of the flip-flop circuits $15_a$ and $15_b$. With such embodiments as seen in FIGS. 17 and 18, it is also possible to achieve the same operation and effects as those of the embodiments shown in FIGS. 16 and 15. In addition, the phase comparators shown in FIGS. 17 and 18 can operate satisfactorily irrespective of the waveforms of the input signals $f_1$ and $f_2$ supplied to the input terminals $1_a$ and $1_b$. By the way, in the case of the embodiments seen in FIGS. 15 and 16, the waveforms of the input signals $f_1$ and $f_2$ have to be less than 50% in duty ratio.

In the above embodiments of the invention, while the flip-flop circuits $15_a$ and $15_b$ and so on are constructed by using the NOR circuits, instead of these NOR circuits, the NAND circuits may be utilized to construct them. If so, only the phase of the output signals $S_{01}$ and $S_{02}$ are inverted, which causes no inconvenience or disadvantage at all.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

I claim as my invention:

1. A phase comparator comprising: a first signal input terminal supplied with a reference signal;
   a second signal input terminal supplied with an input signal to be compared with said reference signal;
   a first trigger pulse oscillator having an input and an output, the input of which is connected to said first signal input terminal to produce a trigger pulse having a predetermined pulse width at its output;
   a second trigger pulse oscillator having an input and an output, the input of which is connected to said second signal input terminal to produce a trigger pulse having a predetermined pulse width at its output;
   a first gate circuit means having a pair of input terminals and an output terminal, one of the pair of input terminals of which is connected to the output of said first trigger pulse oscillator;
   a second gate circuit means having a pair of input terminals and an output terminal, one of the pair of input terminals of which is connected to the output of said second trigger pulse oscillator;
   a first bi-stable circuit means having set and reset signal input terminals, and non-inverted and inverted output terminals, the set signal input terminal of which is connected to the output terminal of said first gate circuit means;
   a second bi-stable circuit means having set and reset signal input terminals, and non-inverted and inverted output terminals, the set signal input termnal of which is connected to the output terminal of said second gate circuit means;
   a first gate control means connected between the inverted output terminal of said second bi-stable circuit means and the other of the pair of the input terminals of said first gate circuit means;
   a second gate control means connected between the inverted output terminal of said first bi-stable circuit means and the other of the pair of the input terminals of said second gate circuit means;
   a first resetting means for supplying the reference signal of said first signal input terminal to the reset signal input terminal of said second bi-stable circuit means; and a second resetting means for supplying the input signal of said second signal input terminal to the reset signal input terminal of said first bi-stable circuit means.

2. A phase comparator according to claim 1, in which said first gate circuit means comprises a first AND gate circuit, and said second gate circuit means comprises a second AND gate circuit.

3. A phase comparator according to claim 1, in which said first trigger pulse oscillator comprises a first inverter having an input and an output, the input of which is connected to said first signal input terminal and a NOR circuit having a pair of inputs and an output, the inputs of which are connected to said first signal input terminal and the output of the first inverter, respectively, and the output of which is connected to the one of the pair of input terminals of said first AND gate circuit.

4. A phase comparator according to claim 3, in which said second trigger pulse oscillator comprises a second inverter having an input and an output, the input of which is connected to said second signal input terminal and a NOR circuit having a pair of inputs and an output, the inputs of which are connected to said second signal input terminal and the output of said second inverter, respectively, and the output of which is connected to the one of the pair of input terminals of said second AND gate circuit.

5. A phase comparator according to claim 1 further including a first inverter having an input and an output, the input of which is connected to said first signal input terminal, and the output of which is connected to a further input terminal of said first AND gate circuit.

6. A phase comparator according to claim 5 further including a second inverter having an input and an output, the input of which is connected to said second signal input terminal and the output of which is connected to a further input terminal of said second AND gate circuit.

7. A phase comparator according to claim 6, in which said first resetting means comprises a first trigger pulse oscillator including an inverter and an AND gate circuit.

8. A phase comparator according to claim 7, in which said second resetting means comprises a second trigger pulse oscillator including an inverter and an AND gate circuit.

9. A phase comparator according to claim 8, in which said first flip-flop circuit comprises a pair of NOR gate circuits.

10. A phase comparator according to claim 9, in which said second flip-flop circuit comprises a pair of NOR gate circuits.

11. Apparatus according to claim 1, including a trigger pulse generator interconnected between said first signal input terminal and said first gate circuit, and a second trigger input generator interconnected between said second signal input terminal and said second gate circuit.

12. Apparatus according to claim 11, wherein each of said trigger pulse generator generates a trigger pulse of predetermined width, said width being short in comparison to the delay of said RS flip-flops in producing a Q output in response to a reset signal.

13. A phase comparator comprising:

a first signal input terminal adapted to receive a reference signal;

a second signal input terminal adapted to receive an input signal to be compared with said reference signal;

first and second RS flip-flops, each having unclocked set and reset inputs and complementary outputs Q and $Q_2$;

a first gate circuit having a pair of input terminals and an output terminal, the output terminal being connected to the set input of said first RS flip-flop, and said pair of input terminals being connected respectively to receive said reference signal and the Q signal from said second RS flip-flop;

a second gate circuit having a pair of input terminals and an output terminal, the output terminal of the second gate circuit being connected to the set input of said second RS flip-flop, and the input terminals of said second gate circuit being connected respectively to receive said input signal and the Q output of said first RS flip-flop;

first reset means for supplying a reset signal to the reset input of said first RS flip-flop in response to said input signal;

and second reset means for supplying a reset signal to the reset input of said second RS flip-flop in response to said input signal.

14. Apparatus according to claim 13, wherein the set and reset inputs of said RS flip-flops operate asynchronisly.

* * * * *